(12) United States Patent
Park

(10) Patent No.: US 6,653,194 B1
(45) Date of Patent: Nov. 25, 2003

(54) METHOD FOR FORMING CONTACT HOLE IN SEMICONDUCTOR DEVICE

(75) Inventor: Kun Joo Park, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/330,913

(22) Filed: Dec. 27, 2002

(30) Foreign Application Priority Data

May 7, 2002 (KR) ................. 10-2002-0025030

(51) Int. Cl.[7] ............................................. H01L 21/336
(52) U.S. Cl. .................... 438/296; 438/196; 438/207; 438/221; 438/435; 438/692
(58) Field of Search ................. 438/196, 207, 438/221, 296, 435, 692, FOR 227, FOR 185, FOR 111

(56) References Cited

U.S. PATENT DOCUMENTS 6,133,105 A    10/2000  Chen et al.
6,297,126 B1   10/2001  Lim et al.
6,350,661 B2    2/2002  Lim et al.

*Primary Examiner*—George Fourson
*Assistant Examiner*—Thanh Pham
(74) *Attorney, Agent, or Firm*—Ladas & Parry

(57) ABSTRACT

Disclosed is a method for forming a contact hole in the process of manufacturing a logic device employing a shallow trench isolation (STI) method. The method prevents an isolation region from being damaged because there is little overlap margin for a contact hole in the active region, when a contact hole is formed in an isolation region beyond the border of an active region, that is, when a borderless contact hole is formed. According to the method, a silicon nitride layer used as an etch-stop layer is formed in the process of providing the STI, thereby avoiding deterioration of the characteristics of a resulting semiconductor device.

7 Claims, 9 Drawing Sheets

METHOD FOR FORMING CONTACT HOLE IN SEMICONDUCTOR DEVICE

BACKGROUND OF THE INVENTION

1. Field of the Invention

The present invention relates to a method for forming a contact hole in a semiconductor device, and more particularly to a method for forming a contact hole which can prevent an isolation region from being damaged because there is little overlap margin for a contact hole in the active region, when a contact hole is formed over both an active region and an isolation region, i.e., when a borderless contact hole is formed.

2. Description of the Prior Art

According to the design of the structure of a logic device, it is necessary to form a contact hole on a gate or active region only. However, as the dimensions of a logic device are reduced, an overlap margin for a contact hole gradually decreases in the active region. As a result, due to a misalignment phenomena caused from a lithography process, a contact hole, which is meant to be formed only in an active region, may be sometimes be partially formed in an isolation region beyond the border of the active region. Such a contact hole is called as "borderless contact hole."

In the conventional process of manufacturing semiconductor devices, it is common to form a contact hole by performing dry etching using plasma formed by activating a '$C_xF_y+O_2$' gas, wherein the '$C_xF_y$' means a gas selected from a group consisting of $CF_4$, $C_2F_6$, $C_4F_8$, $C_5F_8$, etc., or a combination thereof. If desired, $CHF_3$, Ar or the like may be added to that gas or the combination.

Polysilicon or silicide employed for forming a gate or active region has a characteristic of being scarcely etched by such plasma. In such a case, no damage is caused while a contact hole is being etched. However, a silicon oxide-based material ($SiO_{2-\beta}$) employed for forming an isolation region has a characteristic of being easily etched by such plasma. Therefore, a problem arises in that an isolation region is deeply and sharply hollowed out in the process of forming a borderless hole.

FIG. 1 is a drawing for illustrating the problematic situation when a contact hole is formed without using an etch-stop layer. In the drawing, 1 designates a silicon substrate, 2 designates a shallow trench isolation (STI), 3 designates a well, 4 designates a gate oxide layer, 5 designates a gate (polysilicon), 6 designates a silicide layer, 7 designates a spacer, 8 designates a source, 9 designates a drain, 10 designates an interlayer insulation layer, and 11 designates a contact hole.

As the dimensions of logic devices are reduced, the overlap margin for a contact hole decreases in the active region. If such an overlap margin for a contact hole is insufficient in an active region, the contact hole, which is meant to be formed only in the active region, is formed into an isolation region, beyond the border of the active region. As a result, a problem is caused in that the isolation region is deeply and sharply hollowed out, as shown in the drawing. If the isolation region is damaged in the process of forming a contact hole like this, leakage current or deterioration of the properties is caused in a resulting semiconductor device, thereby causing problems in operation of the device.

Therefore, in order to solve this problem, a contact hole is formed using an etch-stop layer in a conventional semiconductor device manufacturing process, which will now be sequentially described with reference to FIG. 2.

Referring to FIG. 2a, a predetermined thickness of a pad oxide layer ($SiO_2$) 22 is deposited on a silicon substrate 21, and then a predetermined thickness of a silicon nitride layer ($Si_3N_4$) 23 is deposited on the pad oxide layer 22. Herein, the deposited silicon nitride layer 23 is used as a polish-stop layer when an oxidation material formed in a subsequent step for filling a trench is planarized using chemical mechanical polishing (CMP) process.

The pad oxide layer 22 serves as a buffer layer for alleviating the mechanical stress influencing on the silicon substrate 21; stress which are induced by the silicon nitride layer 23 having been deposited on the pad oxide layer 22. The thickness of the pad oxide layer 22 and the thickness of the silicon nitride layer 23 may be varied depending on the type of process employed, wherein the pad oxide layer 22 is applied to a thickness of about 70 Å to 200 Å and the silicon nitride layer 23 is applied to a thickness of about 500 Å to 1500 Å.

Next, after a photoresist layer 24 is coated on the silicon nitride layer 23, a pattern of STI (shallow trench isolation) is formed by exposing and developing the photoresist layer 24.

Then, the silicon nitride layer 23 and the pad oxide layer 22 are completely etched by dry etching using activated plasma. Activated gases of plasma may be varied depending on the type of employed process. In general, however, a gas formed by mixing $C_xF_y$, $H_oH_pF_q$, Ar, etc., in a predetermined ratio is mainly used for generating plasma. If the dry etching is continuously performed using activated plasma, a trench 25 is formed in the silicon substrate 21. When forming the trench 25 in the silicon substrate 21, plasma is generated mainly using a gas formed by properly mixing $Cl_2$, HBr, $N_2$, Ar, etc. After the silicon substrate 21 is etched to a desired depth, the remaining photoresist is completely removed.

Thereafter, the trench 25 formed in the step shown in FIG. 2c is filled with an oxide layer ($SiO_2$) 26 deposited using a plasma enhanced chemical vapor deposition (PECVD) process. Here, one or more stepped portions may be formed in the top surface of the deposited oxide layer, which reflects the surface topology of a layer laid under the oxide layer.

The top surface of the oxide layer 26 deposited in the step of FIG. 2a is planarized and the oxide layer 26 deposited on the silicon nitride layer 23' is removed, using CMP process, as shown in FIG. 2b. At this time, the silicon nitride layer 23' serves as a polish-stop layer to prevent the silicon substrate 21 from being polished. During this step, the silicon nitride layer 23' is partially polished and thus its thickness is reduced.

Referring to FIG. 2c, the remaining silicon nitride 23' is removed using a phosphoric acid aqueous solution ($H_3PO_4$). If the concentration and temperature of the phosphoric acid aqueous solution of are properly controlled, the etch selectivity ratio of a typical $SiO_2$ layer to the silicon nitride 23' can be made to exceed about 1:50. Therefore, using the phosphoric acid aqueous solution, it is possible to completely remove the remaining silicon nitride film 23' without damaging the oxide layer 26 filled in the trench 25.

Referring to FIG. 2d, a well 27, a gate 28, a spacer 29, a source/drain 30, and a silicide layer 31 are formed in accordance with the method of manufacturing a typical logic device.

Next, a silicon nitride ($Si_3N_4$) layer 32 is thinly deposited on the entire surface to a thickness of about 200 Å to 400 Å. The deposited silicon nitride layer 32 serves as an etch-stop layer in a subsequent step for forming a contact hole.

Referring to FIG. 2e, after an interlayer oxide film 33 is deposited, the top surface of the interlayer oxide film 33 is planarized using chemical mechanical polishing process. In general, the interlayer oxide film 33 has a thickness of about 7,000 Å to 9,000 Å after the planarization is completed. In most cases, even if the thickness of the interlayer oxide film 33 is controlled to be constant and its planarization is completed, some variations in thickness exist in the interlayer oxide film, due to incompleteness of deposition and subsequent polishing steps.

Next, a photoresist layer 34 is coated on the interlayer oxide film 33, exposed and developed to pattern a form of contact hole.

Referring to FIG. 2f, the interlayer oxide film 33 is etched using plasma generated by activating a '$C_xF_y+O_2$' gas as a main component, so that a contact hole is formed within the interlayer oxide film 33. The etching proceeds in the following manner. The etching is performed using plasma generated by activating a gas having a relatively high ratio of C TO F, for example, $C_4F_8$ or $C_5F_8$ gas, with a minimum amount of $O_2$ being added. If the etching proceeds in this manner, the interlayer oxide film 33 is relatively well etched but an etch-stop phenomenon is generated in the silicon nitride layer 32.

Therefore, even if variations in thickness had been caused in the interlayer oxide film 33 according to the various parts of the wafer in the abovementioned process, those variations are completely removed if the etching reaches the silicon nitride layer 32. If the etching of the interlayer oxide film 33 is completed, the plasma activation condition is changed so that the silicon nitride layer 32 can be etched well. That is, the etching proceeds using plasma generated by activating a gas having a reduced ratio of C to F with an increased amount of $O_2$.

Herein, because the silicon nitride layer deposited in the aforementioned process is thin, it is not necessary to perform excessive over-etching in the silicon nitride layer (for example, for 30% over-etch, it is necessary to perform over-etch of 2,100 to 2,700 Å if no etch-stop layer exists, whereas it is sufficient to perform over-etching of 60 to 120 Å if an etch-stop layer is exist). Accordingly, even if a part of a contact hole, which is meant to be formed within an active region, is partially formed in the isolation region due to misalignment resulting from a lithography process, the problem of the isolation region being deeply and sharply hollowed out will not arise.

When a contact hole is formed according to the aforementioned process, an isolation region is not deeply and sharply hollowed out, as shown in FIG. 2k, even if a part of the contact hole is formed in the isolation region. However, the aforementioned process includes some problems, as follows.

(1) In general, a deposited silicon layer induces a strong compressive stress of about $10^9 dynes/cm^2$. Such strong stress induced by a silicon nitride layer deposited on an active region may deform the crystal structure of the active region, thereby resulting in deterioration of characteristics of a resulting semiconductor device.

(2) In order to properly deposit a silicon nitride layer, an environment of high temperature in the range of about 700 to 1,000 ° C. is required. However, such a high temperature environment may change the operating characteristics of a transistor which has been optimized prior to depositing the silicon nitride layer.

(3) According to an existing method for manufacturing a logic device, silicide (a compound of silicon and a metallic component, i.e., Ti or Co) is formed prior to deposition of a silicon nitride layer. However, the high temperature environment in the range of about 700 to 1,000 ° C. required for deposition of a silicon nitride layer may cause deterioration of the characteristics of previously formed silicide.

(4) In the aforementioned process, a silicon nitride layer is deposited on both of an active region and an isolation region. The silicon nitride layer deposited on the isolation region is helpful in that it serves as an etch-stop layer. If no etch-stop layer exists, however, the active region will be lost when forming a contact hole, thereby causing junction leakage in a resulting semiconductor device.

SUMMARY OF THE INVENTION

Accordingly, the present invention has been made to solve the above-mentioned problems occurring in the prior art, and an object of the present invention is to provide a method for forming a contact hole in a semiconductor device, which can prevent an isolation region from being damaged because there is little overlap margin for the contact hole in the active region, when a contact hole is formed in both an active region and an isolation region, i.e., when a borderless contact hole is formed.

It is also an object of the present invention to provide a method for forming a contact hole in a semiconductor device, wherein a nitride layer is formed beforehand on an active region to solve the problem that characteristics of the device are caused to deteriorate due to the deformation of the lattice structure of the silicon surface in the active region, the deformation resulting from ion implantation.

It is another object of the present invention to provide a method for forming a contact hole in a semiconductor device, wherein a nitride layer is formed beforehand on an active region, thereby simplifying the entire process.

It is still another object of the present invention to provide a method for forming a contact hole in a semiconductor device, wherein a nitride layer formed beforehand serves as an etch-stop layer in the step of etching a borderless contact hole, thereby being capable of securing a process margin.

In order to accomplish the above objects, according to the present invention, there is provided a method for forming a contact hole in a semiconductor device comprising the steps of:

forming a pad oxide layer and a first silicon nitride layer to a predetermined thickness on a silicon substrate;

forming a trench for shallow trench isolation by dry etching the first silicon nitride layer, the pad oxide layer and the silicon substrate;

depositing an oxide layer on the entire structure formed through the above steps, using a plasma enhanced chemical vapor deposition (PECVD) process, so that the trench is sufficiently filled with the oxide layer;

planarizing the oxide layer by means of chemical mechanical polishing process, so that the top of the first silicon nitride layer is exposed;

recessing a part of the oxide layer filled in the trench by means of first plasma etching;

forming a second silicon nitride over the entire structure formed in the above steps to a thickness thicker than the recessed depth of the oxide layer;

planarizing the second silicon nitride layer using CMP process, so that the top of the first silicon nitride is exposed and partially planarized;

selectively removing the first silicon nitride layer and the pad oxide layer by means of a second plasma etching in the portions where a gate and a space are to be formed;

forming a well, a gate, a spacer and a source/drain, and then forming a silicide layer;

depositing an interlayer oxide film on the above structure, and then planarizing the top of the interlayer oxide film using CMP process;

coating a photoresist layer on the interlayer oxide film and then forming a shape of a contact hole by exposing and developing the photoresist layer; and forming a contact hole in the interlayer oxide layer by removing a part of the interlayer oxide layer using a third plasma etching.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
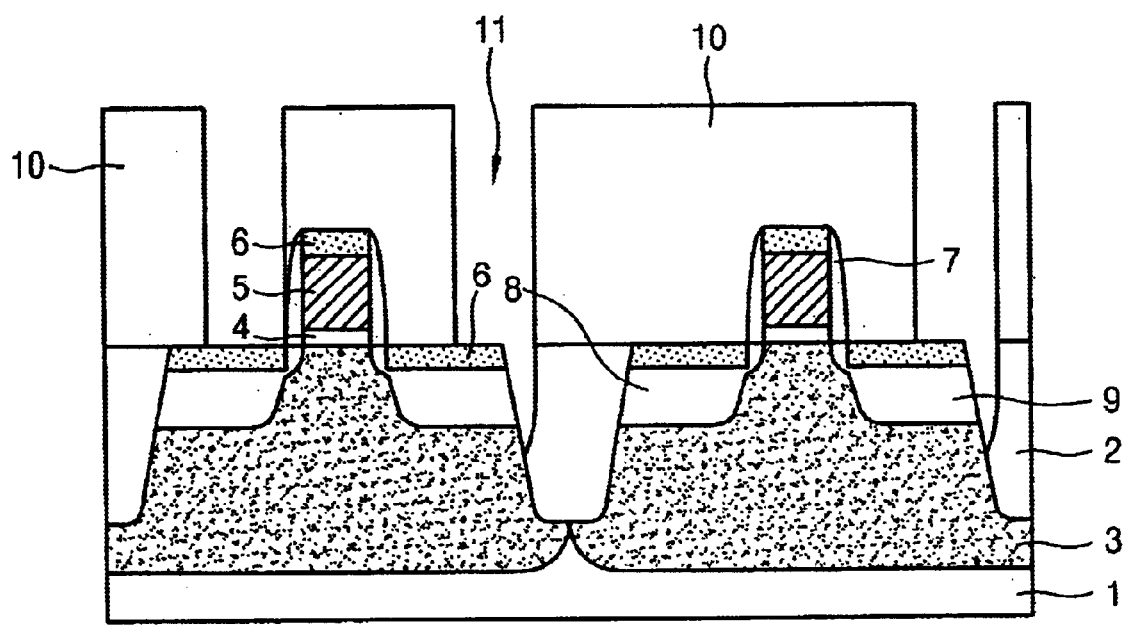
FIG. 1 is a cross-sectional view for illustrating a problem arising in the prior art when forming a contact hole without an etch-stop layer.
Figure 2A:
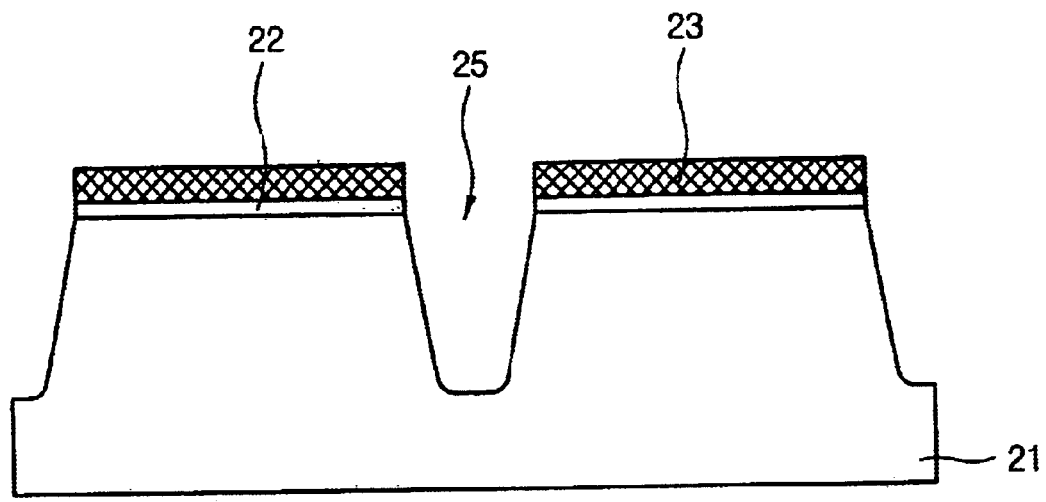
FIGS. 2a to 2f are cross-sectional views for illustrating a problem of a method for forming a contact hole of the prior art using an etch-stop layer.
Figure 2B:
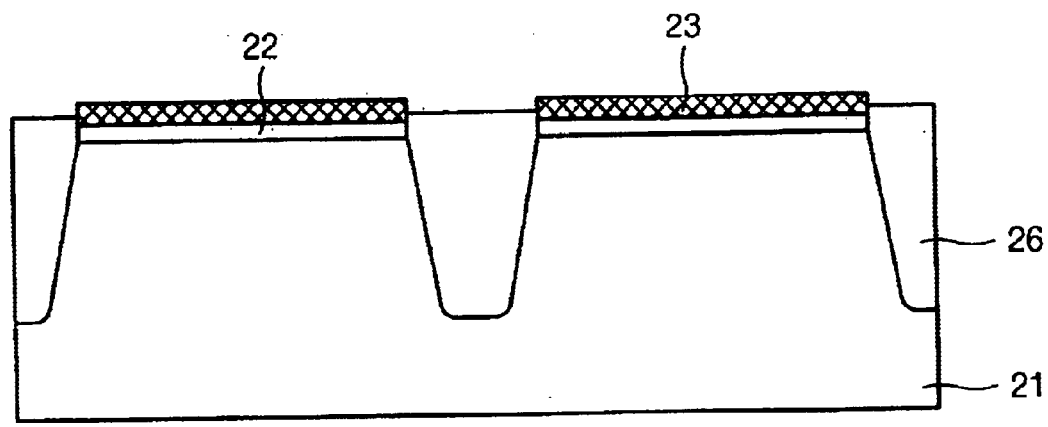
Figure 2C:
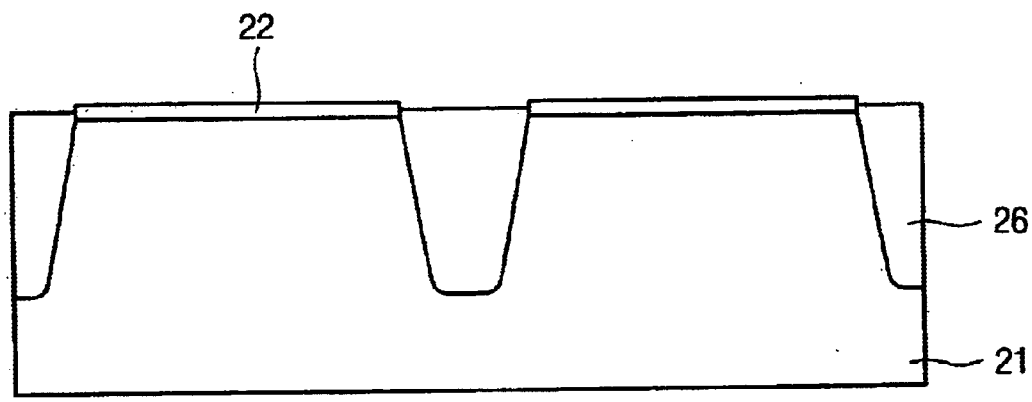
Figure 2D:
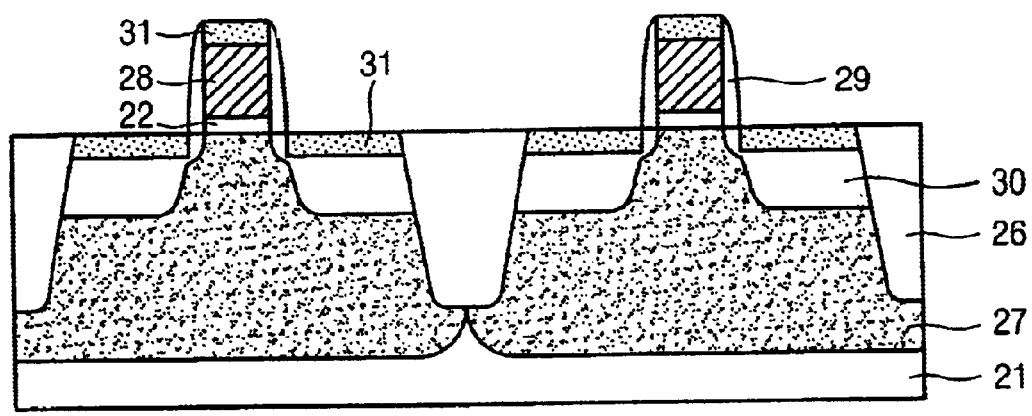
Figure 2E:
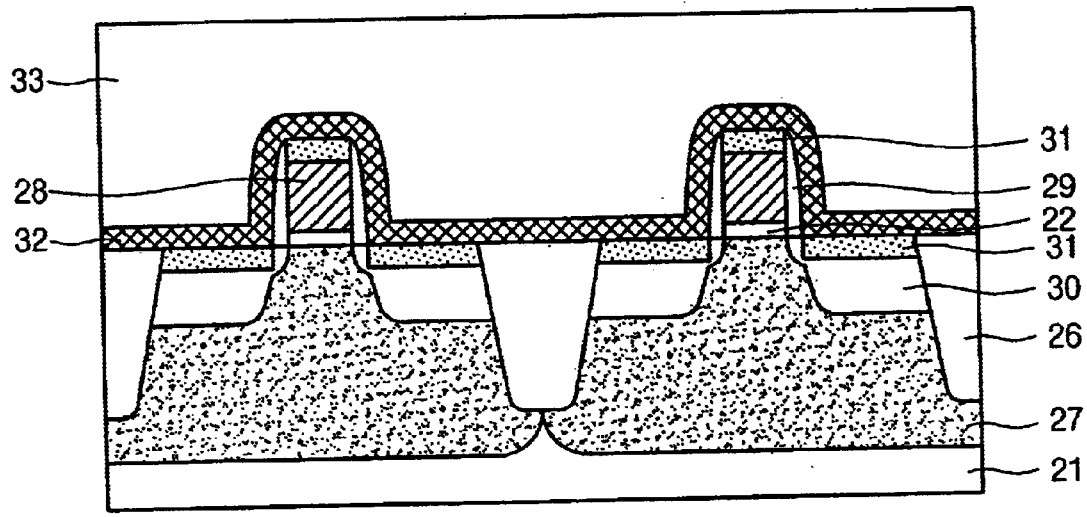
Figure 2F:
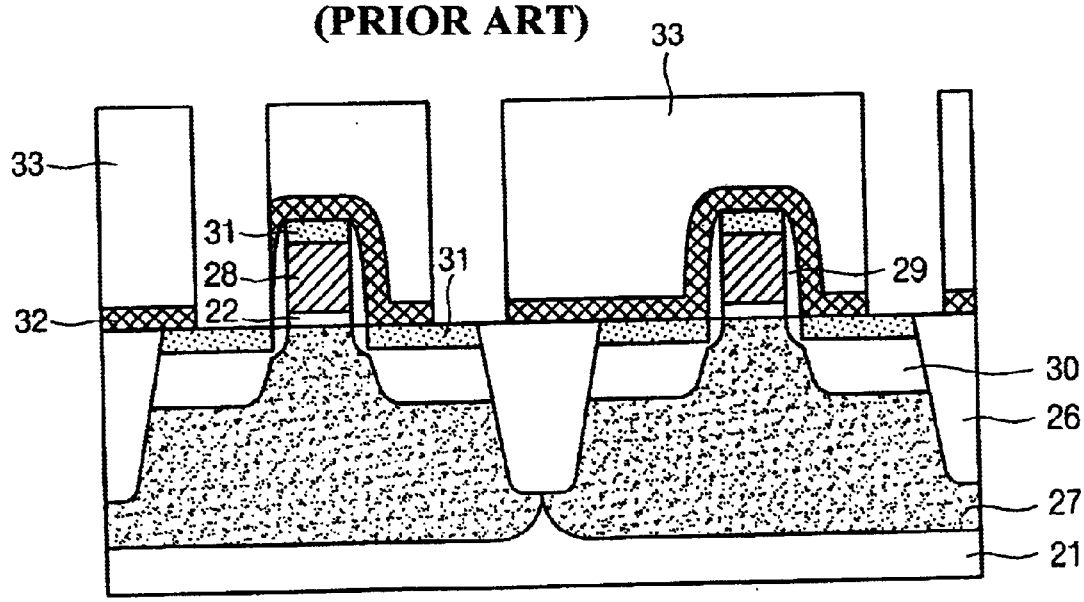

Hereinafter, a preferred embodiment of the present invention will be described with reference to the accompanying drawings. In the following description and drawings, the same reference numerals are used to designate the same or similar components, and so repetition of the description for the same or similar components will be omitted.

FIGS. 3a to 3i are cross-sectional views for illustrating a method for forming a contact hole in a semiconductor device in accordance with the present invention.

Figure 3A:
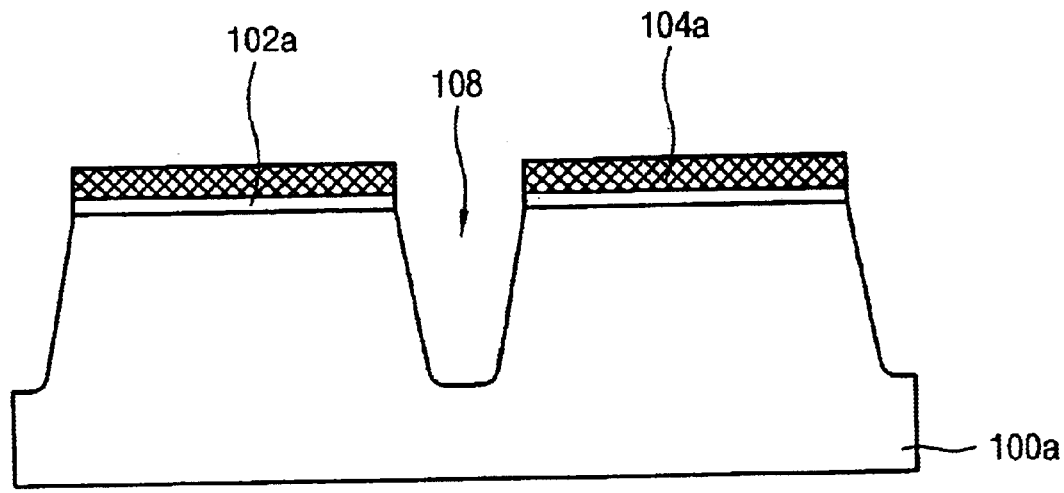
FIGS. 3a to 3i are cross-sectional views for illustrating a method for forming a contact hole in a semiconductor device in accordance with the present invention.

Referring to FIG. 3a, a predetermined thickness of a pad oxide ($SiO_2$) layer 102 is deposited on a silicon substrate 100, and then a predetermined thickness of a silicon nitride ($Si_3N_4$) 104 is deposited on the pad oxide layer 102. Herein, the deposited silicon nitride layer 104 is used as a polish-stop layer when an oxidation material deposited in a subsequent step for filling in a trench is planarized using chemical mechanical polishing (CMP) process.

Next, a photoresist layer is coated on the silicon nitride layer 104a, and the form of a shallow trench isolation (STI) is patterned by exposing and developing the photoresist.

Thereafter, the silicon nitride layer 104a and the pad oxide layer 102a are completely etched by dry etching using activated plasma. Herein, the activated gas of the plasma may be varied depending on the type of process. In general, however, a gas formed by mixing $C_xF_y$, $H_oH_pF_q$, Ar, etc., in a predetermined ratio is mainly used for the plasma. If the dry etch is continuously performed using the activated plasma, a trench 108 is formed in the silicon substrate 100a. When forming the trench 108 in the silicon substrate 100a, a gas formed by properly mixing $Cl_2$, HBr, $N_2$, Ar, etc., is mainly used. After the silicon substrate 100a is etched to a desired depth, the remaining photoresist is completely removed.

Figure 3B:
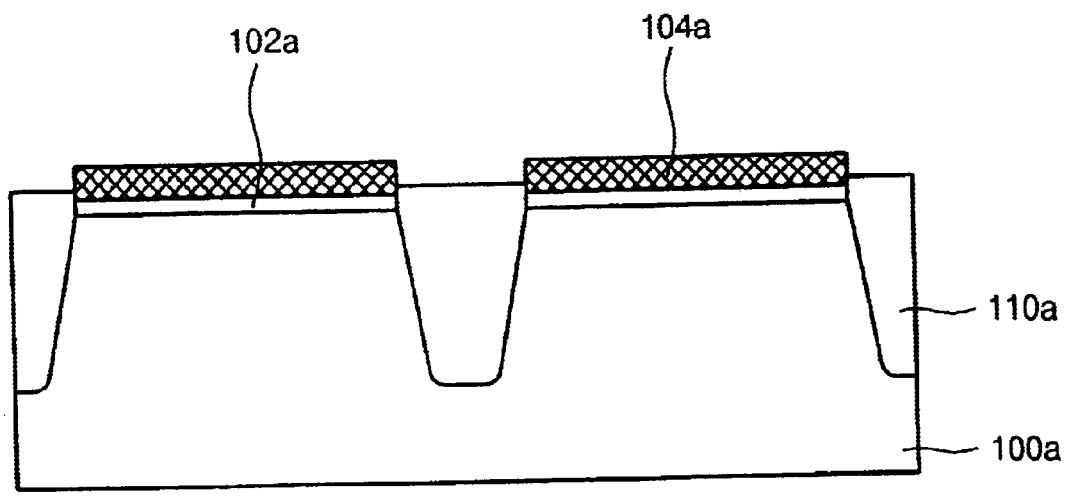
Figure 3C:
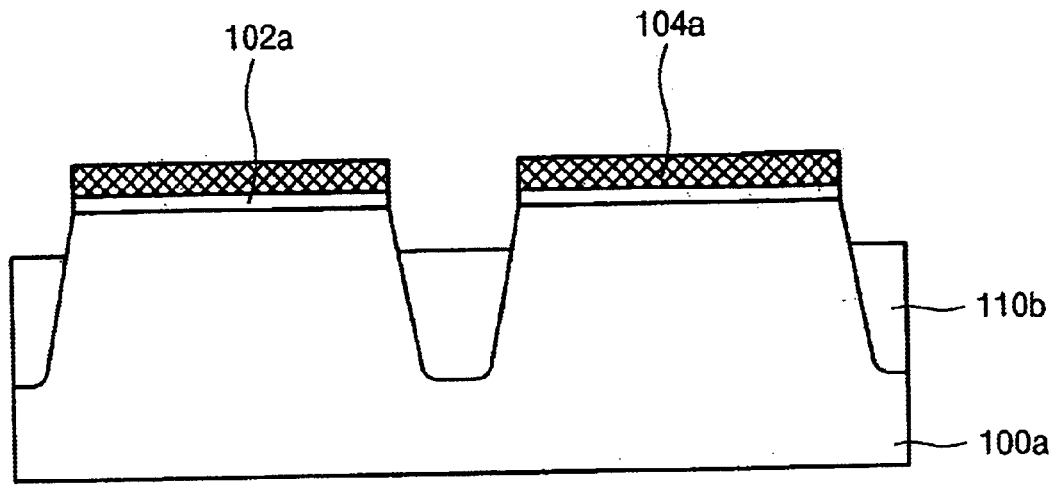

Thereafter, one or more trenches 108 formed in the process shown in FIG. 3c are filled with an oxide ($SiO_2$) layer 110a deposited using a plasma enhanced chemical vapor deposition (PECVD). Here, one or more stepped portions exist in the top of the deposited oxide layer, which reflect the surface topology of the layer below.

Next, referring to FIG. 3b, the top of the oxide layer 110a deposited in the process of FIG. 3a is planarized and, concurrently with this, the oxide layer 110a deposited on the silicon nitride layer 104a is removed, using CMP process. In this case, the silicon nitride layer 104a serves as a polish-stop layer to prevent the silicon substrate 100a under the silicon nitride layer 104a from being polished. During this process, a part of the silicon nitride layer 104a is polished, so that the thickness thereof is reduced.

Referring to FIG. 3c, plasma etching proceeds with a plasma produced by activating a '$C_xF_y+O_2$' gas as a main component, so that a part of the oxide layer 110b filled in the trenches 108 is recessed. At this time, if a gas having a relatively high ratio of C TO F, for example $C_4F_8$ or $C_5F_8$ gas is used while adjusting the added amount of $O_2$, the oxide layer 110b filled in the trenches is relatively rapidly etched but the remaining silicon nitride layer 104a is very slowly etched. If the etching condition is controlled in this manner, the oxide layer 110b filled in the trenches is sufficiently recessed but the pad oxide layer 102a laid under the silicon nitride layer 104a is not damaged.

Figure 3D:
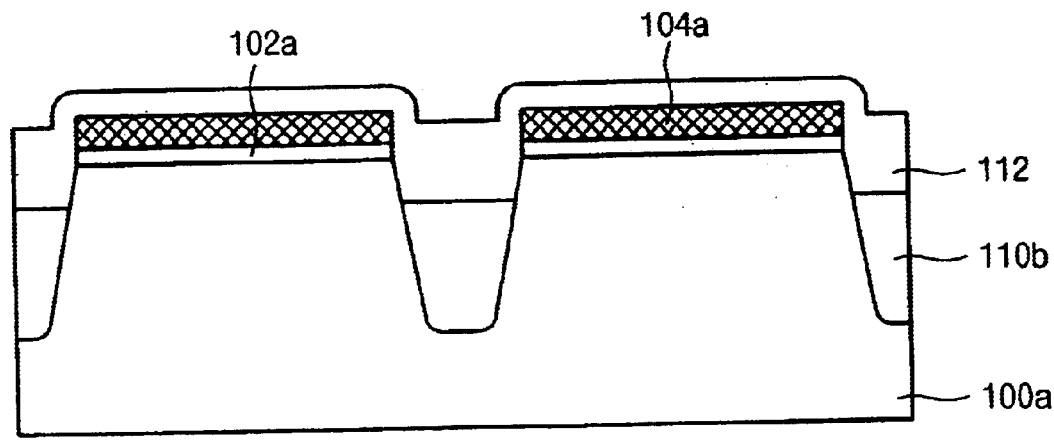

Next, referring to FIG. 3d, a nitride layer ($Si_3N_4$) 112 is deposited on the entire surface to a thickness larger than the recessed depth of the oxide layer 110b etched out in the step of FIG. 3d, for example, to a thickness about 2,000 Å to 3,000 Å.

Then, chemical mechanical polishing (CMP) process is performed, so that a predetermined thickness of the nitride layer 112 deposited in the step of FIG. 3d is removed and the top of the nitride layer 104b on the active layer is planarized. Herein, the thickness of the silicon nitride layer 104b is controlled to be about 300 Å to 500 Å. Then, the portions at which a gate and a spacer are to be formed are patterned using a negative photoresist film.

Figure 3E:
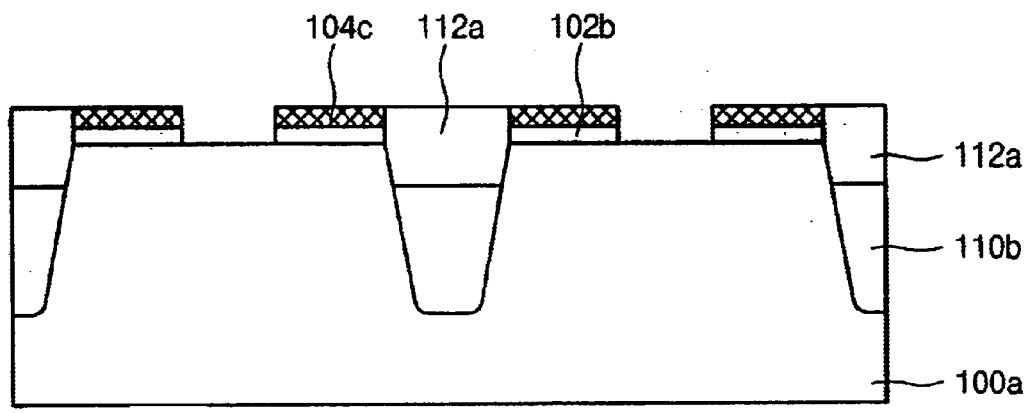

FIG. 3e is a cross-sectional view showing a state after the portions at which the gate and the spacer are to be formed have been patterned. The silicon nitride layer 104c remaining in the other areas after the patterning is used as an etch-stop layer for preventing the isolation region from being damaged when a borderless contact hole is formed in a subsequent contact-etching step. Furthermore, the silicon nitride layer is used as a barrier for preventing the silicon from being damaged. The silicon nitride layer 104c and the pad oxide layer 102b are etched by means of dry etching using plasma formed by activating a '$C_xF_y+O_2$' gas.

Figure 3F:
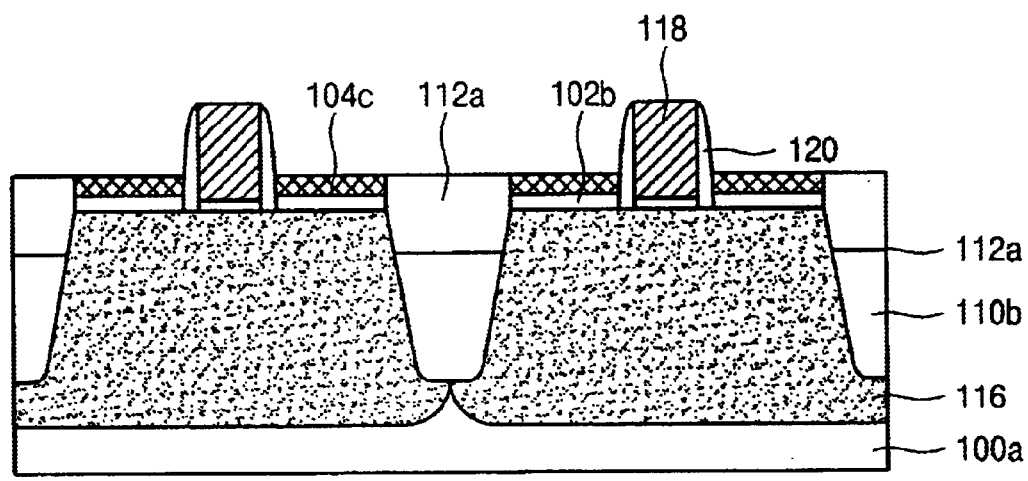

Next, after a well 116 has been formed in accordance with a method for forming a common logic device, a gate 118 and a spacer 120 are formed, as shown in FIG. 3f.

Figure 3G:
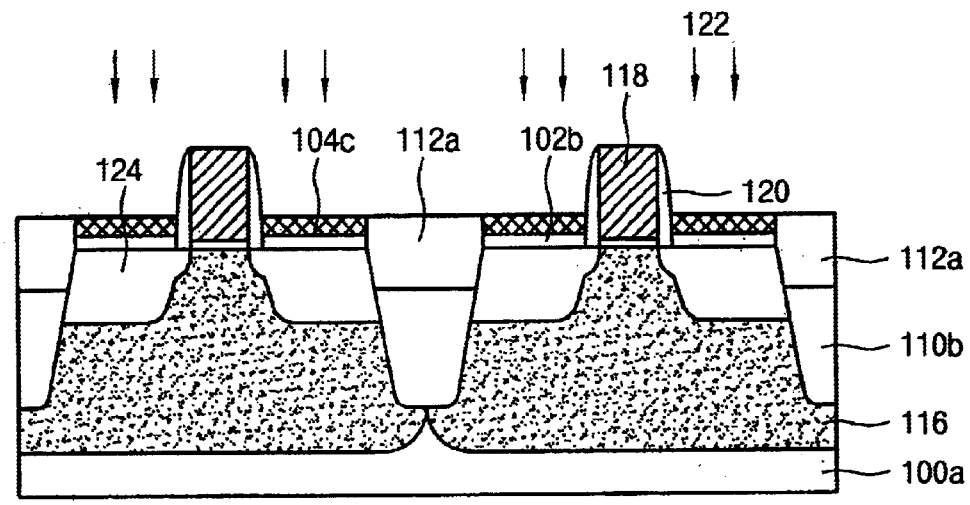

Then, an ion implantation step 122 is performed for forming a source/drain 124, as shown in FIG. 3g. At this time, the silicon nitride layer 104c and the pad oxide layer 102b, on which the source/drain 124 is to be formed, serve as a barrier against the ion implantation, thereby preventing the surface of the silicon substrate 100a from being damaged.

Next, like the existing method described above, an interlayer oxide film 126 is deposited and its top surface is planarized using chemical mechanical polishing (CMP) process.

Figure 3H:
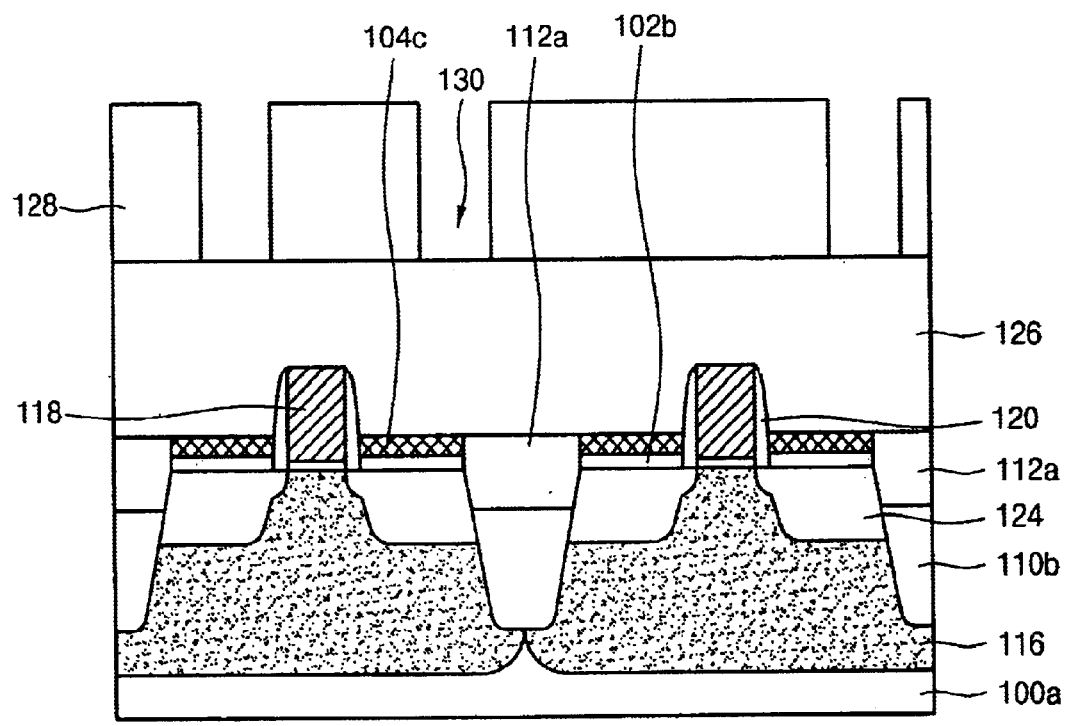

Next, like the existing method described above, a photoresist layer 128 is coated on the interlayer oxide film 126, and the contact hole 130 is patterned by exposing and developing the photoresist layer, as shown in FIG. 3h.

Figure 3I:
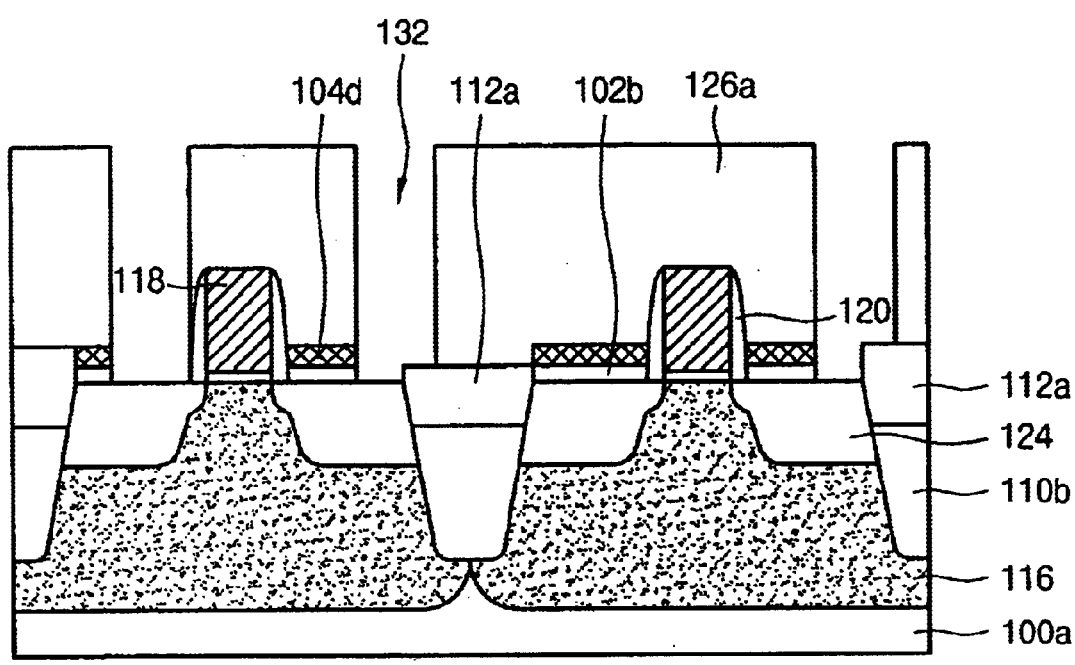

Next, referring to FIG. 3i, a contact hole 132 is formed in the interlayer oxide 126a by etching the interlayer oxide film 126 using plasma generated by activating a '$C_xF_y+O_2$' gas as a main component. When etching the interlayer oxide film 126a, like the existing method described above, the etching proceeds using plasma generated by activating a gas having a relatively high ratio of C to F, for example, $C_4F_8$ or $C_5F_8$ gas, with a minimum amount of $O_2$ being added.

If the etching proceeds in this manner, the interlayer oxide film 126a may be relatively well etched but an etch-stop phenomenon may be generated in the silicon nitride layer 104d. Like the existing method, some variations in thickness arise in the interlayer oxide film 126a depending on the portions on a wafer. Therefore, it is necessary to perform sufficient over-etching so that those variations are removed. Even if such over-etching is performed, however, a problem, which renders the isolation region to be deeply and sharply hollowed out, will not arise because a predetermined thickness of the silicon nitride layer 104d exists on the isolation region and serves as an etch-stop layer.

According to the method of the present invention, it is possible to secure a margin for etching a borderless contact hole and to prevent the surface of the silicon substrate from being damaged at the time of ion implantation. Furthermore, it is also possible to prevent the isolation region from being recessed, so that junction leakage current will not be generated in a resulting semiconductor device.

As described above, according to the present invention, it is possible to prevent an isolation region from being damaged because there is little overlap margin for the contact hole in the active region, when a contact hole is formed in an isolation region beyond the border of an active region, i.e., when a borderless contact hole is formed.

According to the present invention, because a nitride layer is formed beforehand on an active region, it is also possible to solve the problem that a characteristic of the device deteriorates due to the deformation of the lattice structure of the silicon surface of the active region caused from ion implantation.

Furthermore, by forming a nitride layer beforehand on an active region, it is possible to simplify the entire process. In addition, because the nitride layer formed beforehand serves as an etch-stop layer in the step for forming a borderless contact, it is possible to secure a process margin.

The preferred embodiment of the present invention has been described for illustrative purposes, and those skilled in the art will appreciate that various modifications, additions and substitutions are possible, without departing from the scope and spirit of the invention as disclosed in the accompanying claims.

What is claimed is:

1. A method for forming a contact hole in a semiconductor device comprising the steps of:

forming a pad oxide layer and a first silicon nitride layer on a silicon substrate;

forming a trench on a part of the entire structure formed in the above step and forming an oxide layer on the entire structure including the trench;

selectively etching the oxide layer so that the oxide layer remains only within the trench;

forming a second silicon nitride layer over the entire structure including the oxide layer remaining in the trench planarizing the second silicon nitride layer and a part of the first silicon nitride layer, so that the top surface of the first silicon nitride layer is exposed, and then selectively etching a part of the first silicon nitride layer and the pad oxide layer to define a gate region;

forming a gate within the etched part for defining a gate region in the first silicon nitride layer and the pad oxide layer, and then forming a source/drain in the silicon substrate under each side of the gate; and forming an interlayer oxide film over the above structure and selectively etching the interlayer oxide film to form a contact hole in the interlayer oxide film which exposes the source/drain.

2. The method according to claim 1, wherein a gas formed by mixing $C_xF_y$, $C_oH_pF_q$ and Ar in a predetermined ratio is used for etching the first silicon nitride layer and the pad oxide layer.

3. The method according to claim 1, wherein a gas formed by mixing $Cl_2$, HBr, $N_s$, and Ar is used for forming the trench.

4. The method according to claim 1, wherein the etching of the oxide layer within the trench is performed by means of plasma etching using a '$C_xF_y+O_2$' gas, wherein the selective etching of the first silicon nitride layer and the pad oxide layer is also performed by means of plasma etching using a '$C_xF_y+O_2$' gas, and wherein the etching of the interlayer oxide film is performed by means of plasma etching using a '$C_xF_y+O_2$' gas as a main component.

5. The method according to claim 4, wherein the oxide layer within the trench is etched at a relatively high speed and the remaining first silicon nitride is etched at a very low speed by using the '$C_xF_y+O_2$' gas and controlling the added amount of the oxygen ($O_2$).

6. The method according to claim 1, wherein the pad oxide layer laid under the first silicon nitride layer is remained without being damaged even if the oxide layer within the trench is fully etched at the time of plasma etching of the oxide layer within the trench.

7. The method according to claim 1, wherein the interlayer oxide film is plasma etched using a gas which has a high ratio of C to F, e.g., $C_4F_8$ or $C_5H_8$ gas with a minimum amount of $O_2$ being added.

* * * * *